(12) United States Patent
Ottobon et al.

(10) Patent No.: US 10,091,883 B2
(45) Date of Patent: Oct. 2, 2018

(54) DIELECTRIC FILMLESS ELECTRONIC MODULE AND METHOD FOR MANUFACTURING SAME

(71) Applicant: GEMALTO SA, Meudon (FR)

(72) Inventors: Stéphane Ottobon, La Ciotat (FR); Lucile Dossetto, La Ciotat (FR); Line Degeilh, La Ciotat (FR)

(73) Assignee: GEMALTO SA, Meudon (FR)

( * ) Notice: Subject to any disclaimer, the term of this patent is extended or adjusted under 35 U.S.C. 154(b) by 52 days.

(21) Appl. No.: 14/903,770

(22) PCT Filed: Jun. 19, 2014

(86) PCT No.: PCT/EP2014/062973
§ 371 (c)(1),
(2) Date: Jan. 8, 2016

(87) PCT Pub. No.: WO2015/003884
PCT Pub. Date: Jan. 15, 2015

(65) Prior Publication Data
US 2016/0183377 A1    Jun. 23, 2016

(30) Foreign Application Priority Data

Jul. 10, 2013   (EP) ..................................... 13305985
Aug. 23, 2013  (EP) ..................................... 13306169

(51) Int. Cl.
*H05K 5/02*        (2006.01)
*H05K 1/18*        (2006.01)
(Continued)

(52) U.S. Cl.
CPC ....... *H05K 1/181* (2013.01); *G06K 19/07747* (2013.01); *H05K 1/032* (2013.01);
(Continued)

(58) Field of Classification Search
CPC ............... H01L 21/4821; H01L 23/495; H01L 23/49541; H01L 23/49866;
(Continued)

(56) References Cited

U.S. PATENT DOCUMENTS 4,833,022 A    5/1989   Bridges et al.
4,835,846 A    6/1989   Juan et al.
(Continued)

FOREIGN PATENT DOCUMENTS

CN       1224566        7/1999
EP       0 307 773 A1   3/1989
(Continued)

OTHER PUBLICATIONS

International Search Report (PCT/ISA/210) dated Oct. 21, 2014, by the European Patent Office as the International Searching Authority for International Application No. PCT/EP2014/062973.
(Continued)

*Primary Examiner* — Binh Tran
(74) *Attorney, Agent, or Firm* — Buchanan Ingersoll & Rooney PC

(57) ABSTRACT

The invention relates to an electronic module comprising a first metal layer including at least one contact pad or a conductive pad for connection or interconnection, an insulating layer that is electrically connected to the metal layer via a first surface, a second metal layer connected to the insulating layer on the opposite surface thereof, a chip location or an electronic chip electrically connected to the at least one contact pad through openings in the insulating layer, characterized in that the insulating layer is an adhesive.

13 Claims, 3 Drawing Sheets

(51) Int. Cl.
*G06K 19/077* (2006.01)
*H05K 1/03* (2006.01)
*H05K 1/11* (2006.01)
*H05K 3/32* (2006.01)
*H05K 3/40* (2006.01)
*H05K 7/18* (2006.01)
*H01R 9/00* (2006.01)
*H01L 21/48* (2006.01)
*H01L 23/498* (2006.01)
*H01L 23/495* (2006.01)
*H01L 33/62* (2010.01)

(52) U.S. Cl.
CPC ............ *H05K 1/112* (2013.01); *H05K 1/189* (2013.01); *H05K 3/32* (2013.01); *H05K 3/4007* (2013.01); *H01L 21/4821* (2013.01); *H01L 23/495* (2013.01); *H01L 23/49541* (2013.01); *H01L 23/49579* (2013.01); *H01L 23/49866* (2013.01); *H01L 33/62* (2013.01); *H01L 2224/45144* (2013.01); *H01L 2224/48091* (2013.01); *H01L 2224/48228* (2013.01); *H01L 2224/49171* (2013.01); *H01L 2924/181* (2013.01); *H05K 1/0393* (2013.01)

(58) Field of Classification Search
CPC . H01L 31/02013; H01L 23/498; H01L 33/62; H01L 23/49579; H01L 23/49582; H01L 23/49883
USPC ....... 361/723, 813, 760, 764, 765, 772, 783; 257/666, 673, 676, 677; 174/529, 536
See application file for complete search history.

(56) References Cited

U.S. PATENT DOCUMENTS

| | | |
|---|---|---|
| 6,717,819 B1 | 4/2004 | Chung |
| 2001/0030122 A1 | 10/2001 | Hara et al. |
| 2004/0159462 A1 | 8/2004 | Chung |
| 2010/0202150 A1 | 8/2010 | Adams |
| 2013/0062419 A1* | 3/2013 | Finn ................. G06K 19/07718 235/492 |

FOREIGN PATENT DOCUMENTS

| | | |
|---|---|---|
| EP | 0 438 742 A1 | 7/1991 |
| EP | 2 178 032 A1 | 4/2010 |

OTHER PUBLICATIONS

Written Opinion (PCT/ISA/237) dated Oct. 21, 2014, by the European Patent Office as the International Searching Authority for International Application No. PCT/EP2014/062973.

First Search Issued in Corresponding Chinese Patenet Appliication No. 201480039154X, dated Jul. 25, 2017 (1 page).

* cited by examiner cross section A-A cross section B-B

DIELECTRIC FILMLESS ELECTRONIC MODULE AND METHOD FOR MANUFACTURING SAME

The invention relates to the technical field of electronic modules and methods for manufacturing electronic modules, in addition to electronic devices, particularly chip cards, comprising such an electronic module.

As a rule, electronic modules are formed by assembling a dielectric film and a metallised layer. The metallised layer comprises contact pads of a connection terminal, designed to be flush with the surface of an electronic device such as a chip card. An electronic chip is attached to the surface of the dielectric film, opposite the metallised layer, having contact studs connected to the different contact pads of the metallised layer.

Conventionally, the chip is attached to the dielectric film, with the former's active surface facing the outside of the film, wherein its contact studs are connected to the contact pads by means of gold wires passing through spaces reserved in the thickness of the dielectric film, opposite the contact pads. The chip is subsequently encapsulated in a protective resin.

The current dual-communication interface modules are expensive, since they comprise a front and back metallic film, broad connection areas to provide interconnection with an antenna positioned in a chip card body, an encapsulation resin and seven soldered wires for electrical connection of the chip to the module.

Dual interface films (contact/contactless) comprise a stack of layers as follows: metallised copper/adhesive/dielectric/adhesive to adhesively attach the second copper surface to the dielectric/metallised copper. In some cases, there may not be any adhesive on both copper surfaces. In particular, in the case of etched technologies, one of the adhesives may be replaced by hot laminating the copper on to the epoxy matrix of the dielectric. The following superimposition is thus obtained: metallised copper/dielectric/ adhesives in order to adhesively attach the second layer of copper/metallised copper.

In order to connect the ISO 8716 contacts to the chip and connect the two pads designed to provide the link between an antenna of the card and the chip, the flexible circuit must be double-sided (with two copper surfaces). This makes it more expensive than single-sided films, which are produced based on a copper, an adhesive and a dielectric.

Furthermore, the fact of having two copper surfaces with patterns makes it almost impossible to use the stamped and laminated grid technologies that can be used for a single surface and which are in turn more economically viable. Indeed, in the case of a double-sided film, it would be necessary to perform dual lamination of two stamped grids and succeed in indexing the latter to +/−100 μm, which is virtually impossible industrially.

Reducing the size of the modules is not possible for dual-interface modules. Front and back modules for a dual interface are approximately three times more expensive than small modules of the electrical contact type. The same problem affects modules for multi-component cards that may comprise in particular a display and require printed circuit interconnections.

The aim of the invention is therefore to eliminate at least one of the disadvantages of the prior art. The invention aims in particular to offer an electronic module that is easy to manufacture and low-cost.

In its principle, the costly dielectric film (particularly epoxy) is replaced with an adhesive film, preferably adhesive in its entirety, or in the mass (100% homogenous) or a 100% adhesive layer/mass). Preferably all the places or lines where metal (copper) is absent on one of the two sides of the metallisations are covered at least partially (covered over at least 30% of the area of the above places or lines) or roughly in their majority (for example, covered over an area greater than 50% of the area of the above places or lines) or roughly in their entirety, with metal by a second layer and conversely.

As a consequence, stiffness is maintained; hence, no zone of the module is weakened at the position, zone or line only having adhesive in the direction perpendicular to the overall plan of the module.

To this end, the subject of the invention is an electronic module comprising a first metal layer including at least one contact pad or a conductive pad for connection or interconnection, an electrically insulating layer that is connected to the metal layer via a first surface and a second metal layer connected to the insulating layer on the opposite surface thereof. The module is characterised in that the insulating layer is an adhesive.

According to other characteristics or variants of embodiment of the module:

An electronic chip is electrically connected to said at least one contact pad, through openings in the insulating layer;

The second metal layer is arranged in relation to the first layer or conversely, so as to overlap perpendicularly, either entirely or at least predominately, the dividing or discontinuity lines of the contact pads or the metal zones of the first layer;

The second metal layer is formed of a continuous layer with connection perforations or a layer with regular cut-outs;

The second metal layer forms at least two pads for interconnection designed to connect pads for connections of an antenna and extending roughly over the entire bottom surface of the module;

The second metal layer forms at least one antenna and/or pads for connection to the chip.

The subject of the invention is also an electronic device comprising the module described above, such as a chip card or an electronic key . . . .

The subject of the invention is also a method for manufacturing an electronic module comprising the following stages of:

application of a first metal layer comprising at least one contact pad of a connection terminal, application of a second metal layer comprising at least one metal pad, attachment of an electrically insulating layer to a first surface of the metal layer in order to form an assembly, formation of orifices (or openings) in the assembly comprising the preceding two layers, wherein said orifices are intended to have a conductor passing through for connecting an electronic component such as an integrated circuit chip, attachment of the first metal layer to the assembly via the insulating layer, characterised in that the electrically insulating layer is selected from an adhesive, a heat-activated adhesive or an adhesive film.

According to one characteristic, the method comprises a stage of arranging the second metal layer in relation to the first layer or conversely, so as to overlap perpendicularly, either entirely or at least predominately, the dividing or discontinuity lines of the contact pads or of the metal zones of the first layer.

DESCRIPTION OF THE FIGURES

FIG. 4 shows a cross-sectional view of the complete module M1 comprising the double-sided film in FIGS. 3A and 3B, equipped with a chip 7 connected by protective encapsulation 8;

DESCRIPTION OF EMBODIMENTS

In the continuation of the description, "front", "visible surface", "outer surface" or "external layer" of an electronic module means the side intended to be flush with the surface of an electronic device. In contrast, "rear" or "hidden surface" means the side of the module intended to be slotted into the cavity of an electronic device and be concealed from the outside.

The term "metal layer" is used to denote a layer comprising electrically conductive metal zones, delimiting for instance contact pads and interconnection tracks. Conversely, the term "metal film or sheet" denotes an entirely metal layer without delimitation of specific zones.

The terms "copper", "copper grid" and "copper layer" may represent respectively and interchangeably "metal", "metal grid" and "metal layer" other than copper. In some cases, conductive surfaces or layers, particularly made of conductive carbon or polymer may replace an electrically conductive metal sheet without departing from the framework of the invention.

In the different embodiments described, the contact pad may belong to a terminal for connection to one or several contact(s) for connection of an external contact reader or may be replaced with an electrically conductive pad for connection or interconnection or a radiofrequency communication interface.

Figure 1:
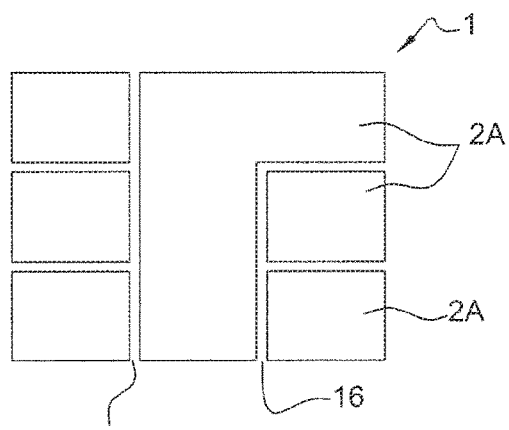
FIGS. 1-4, represent diagrammatic views of the implementation stages of the method of producing an electronic chip module without a dielectric according to a first embodiment of the invention; these figures illustrate in FIG. 1, a top view of a first contact grid following cutting from its transport medium (ribbon), then in FIG. 2A, a top view of a second grid with an adhesive on top on the inside intended to be fixed to the first grid, then in FIG. 2B a cross-section along A-A of FIG. 2A, then a FIG. 3A representing object 3 in FIG. 2A covered by grid 1 in FIG. 1 to form a double-sided leadframe (LF) laminated module film and subsequently in FIG. 3B, a cross-sectional view along B-B of FIG. 3A.

FIG. 1 represents a copper grid pattern 1 following mechanical cut-out.

A copper grid 1 may be provided in a conventional manner, particularly by continuous reel tape or in a customised fashion with if necessary bridges for mutually holding the contact pads and/or tracks for current supply (or for earthing) to be subsequently cut out. The visible surface in the drawing is the front intended to contact a contact reader. The grid is shown in a top view.

Figure 2A:
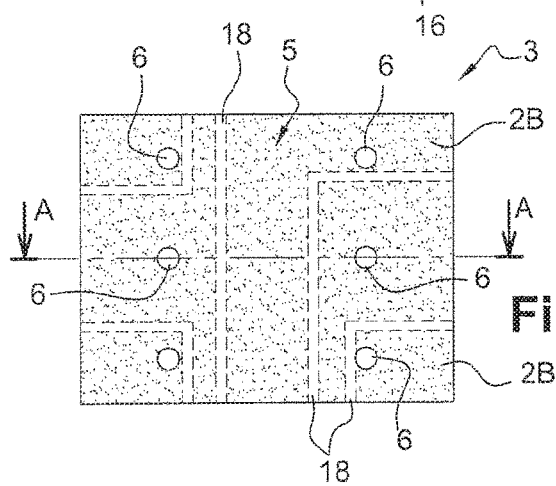

FIG. 2A represents a copper grid pattern after lamination with an adhesive and following mechanical cut-out. The adhesive may be "liquid" and be spread using a suitable method.

The copper grid may be provided as before in the form of a continuous tape or a plate and is shown in a top view (surface designed to be in contact with the adhesive film), but with a pattern of contact pads or interconnection 2B different from that of the previous grid. This grid 2B is laminated (preferably before cutting) with an adhesive film, particularly heat-activated (reversible or not), on this surface. The assembly (grid+adhesive film) manufactured in particular by hot or cold lamination has been subsequently perforated with holes 6 (passing through the assembly); these holes will serve for passage of electrical connections, particularly wire or conductive resin. These holes may be sized or accompanied by a resin insulating bridge in order to avoid a short circuit. The conductor wires may comprise an insulating coating or enamel if necessary.

Figure 2B:
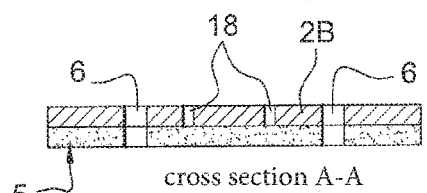
Figure 3A:
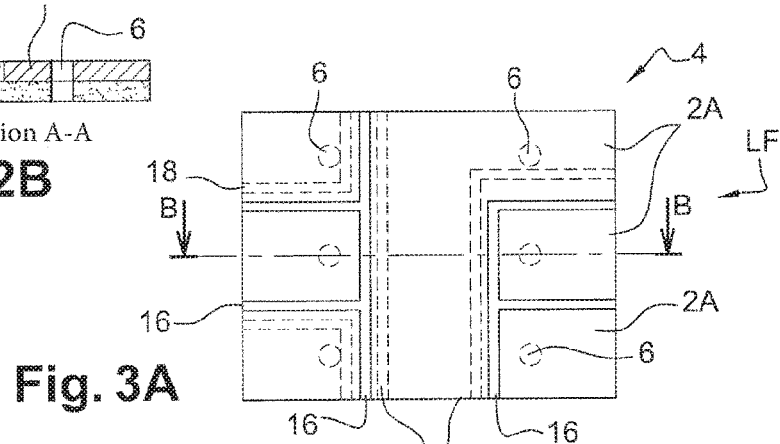

FIGS. 3A (top view) and 3B (cross-sectional view along B-B illustrates the LF double-sided film obtained by lamination of the grid (1 or 2A) in FIG. 1 on the laminate 3 in the previous FIGS. 2A, 2B. The grid 2A is attached by adhesion to the laminated assembly 3 in the preceding figure in order to show an offset of the dividing lines 16 and 18 between the two grids 2A and 2B. It is advantageously observed here, in an optimum configuration, that no dividing line 16 of the contact pads 2A intersects a dividing line 18 of the interconnection pads of the other grid 2B (by projection perpendicular to the main surface) and conversely. This having being said, in a less optimised configuration, it is not inconceivable to have a few minor overlaps (less than 50% of the area of each weak straight line or zone) without departing from the framework of the invention.

One of the metal layers or sheets may have cut-outs at least at the level of the weak lines or zones exposed by the other metal layer in order to cover approximately up to 50-40% of the weak line or zone and thus form reinforcing surfaces.

The metal reinforcing surfaces are situated perpendicular to the lines or zones of weakness and extend underneath the pads to overlap the latter perpendicularly; these reinforcing surfaces are preferably distributed regularly under the lines or zones of weakness. The layer may for example be a chequered grid etched or cut from a solid metal sheet. Also for exampled, a chequered pattern or a perpendicular or diagonal crossing of the lines or zones of weakness may be obtained by a helix of an active or passive antenna connected or unconnected to the chip. The person skilled in the art can adjust by means of mechanical tests the rate of reinforcement and distribution required depending on the thickness of the metal sheet, its mechanical strength properties and the expected durability.

The two metal layers in the drawings may possibly be swapped: for instance, the reinforcement such as an antenna may be on the outside of the device and contact or interconnection pads, or indeed capacitor plates may be on the inside.

However, the value of the invention lies rather in a contact or hybrid module (contact and radiofrequency) of an integrated circuit chip card owing to the mechanical tests to be observed.

The inventors had noticed that chip cards having modules with electrical contacts comprising merely contact pads on a heat-adhesive material (without dielectric support film) for adhesion to a card body could quickly display cracking at the dividing lines of the electrical contact pads (or in the zones between the pads).

The dual-interface film may be produced via a conventional technology, referred to by the state of the art by "laminated leadframe" (supplied by the PRETEMA company for example), but which in the invention offers the advantage of elimination of the dielectric and provision of the electrical insulation by an adhesive placed between the 2 layers or grid made of copper or another conductive metal.

The dielectric formerly used may be a fibreglass-reinforced epoxy resin, a polyethylene terephthalate (PET) film, a polyimide film, a polyethylene naphthalate (PEN) film or a polyvinyl chloride (PVC) film. The invention does not comprise this type of dielectric generally assembled by a layer of adhesive on a metal grid or layer.

This adhesive may have a thickness of between 15 and 50 µm. The two grids required (of a thickness of between 50 and 100 µm) may be cut out mechanically before being laminated to each other in the same manner as if a metal grid and a dielectric were involved and moreover on existing machines.

One of the principles of the invention lies in particular in ensuring adequate rigidity at all points displaying a weakness in mechanical strength, particularly perforation or absence of metal on one of the two surfaces of the copper. Compensation is provided at these points by the presence of copper (or another metal) of the second layer or vice versa. Hence, the finished film (following lamination) does not in principle comprise any or comprises only few through holes, or any weakened zone or line, or only the adhesive is present perpendicularly to the main surface of the laminated film. This concerns in particular zones extending significantly over the surface of the module, particularly dividing lines of contact pads extending over at least ⅓ of the width of the modules.

The bottom layer of copper laminated with the adhesive is perforated in order to create the blind holes for connection to the chip studs, as is the case at present with the dielectric.

The double-sided film according to one embodiment of the invention can be produced in the same manner as a single-sided film, i.e. a single lamination: copper/adhesive/copper. This results in reduction of the price of a dual-interface film to that of a single-sided film (price divided overall by two), by eliminating the dielectric film and one lamination stage. If necessary, the holes can be bored beforehand separately in the adhesive and second metal layer 2B.

The adhesive may be fixed or provided by any known means, for example sprayed by inkjet on to one of the grids with formation of holes during the same operation, in solid, liquid, polymerisable, heat-activated form, by silkscreen printing . . . . The adhesive may consist of a film or a heterogeneous adhesive mass, either continuous or discontinuous, but preferably homogenous.

Furthermore, manufacture of the film is considerably simplified by eliminating lamination, as this reduces the number of operations, all the more so in that there is little cutting of both grids (in order to avoid leaving areas held only by the adhesive); the metal double-sided film is therefore relatively robust and easy to employ.

The selective metallisation techniques that have become commonplace in the field of manufacturing flexible electronic circuits (by masking or mechanical tools) make it possible to reduce precious metal deposits (Au, Pd, . . . ) to a strict minimum. The absence of a dielectric and the fact that the copper grid is relatively dense is therefore not detrimental in terms of cost.

Both grids can be metallised selectively exactly at the places where they are needed: on the ISO contacts, the soldering zones and for the antenna connection areas if necessary.

Always ensuring the presence of one of the two copper layers at the perforations ensures the rigidity of the whole and avoids reliability problems of the finished product. Furthermore, it is also possible to retain the copper of the second surface 2B under the chip, thereby ensuring good rigidity under the latter too. The chip is to be adhesively attached using a non-conductive adhesive.

The total thickness of the double-sided film thus produced is approximately equal to the current thickness (presently 165 µm). This makes it possible to avoid modifying the card body structures drastically.

The cut-outs of the contact pads are preferably positioned and/or arranged/sized so as to avoid short circuits with the connection wires that might touch the edge of a blind hole (each zone of the ISO contacts on the chip side is separate).

In the embodiment in FIG. 3A, the second metal layer 2B comprises pads separated from one another for in particular enhanced electrical insulation in comparison to the embodiment in FIG. 6 described further below.

Another advantage is that the surface area of the contactless pads for antenna connection Z1, Z2 are thus maximised, which may make the methods for connection to the antenna easier (subsequent installation) in terms of size and position of the conductive elements for example.

Figure 3B:
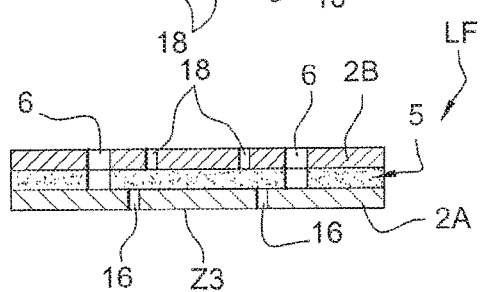
Figure 4:
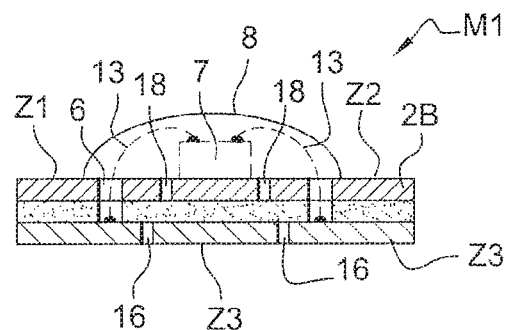

FIG. 4 shows a cross-sectional view of a module M1 connected to a chip 4 by electrical connection wires; the chip is repositioned and connected to the double-sided film 4 of FIG. 3A, 3B. A protective resin 8 covers the chip 7 and its connections 13. The chip is connected to interconnection pads 2B comprising interconnection zones Z1, Z2 designed to be connected to an antenna located in the body of a card receiving the module M1.

Likewise, the large surface of the latter interconnection pads allows major flexibility in the choice of the wire soldering zones or for connecting the chip to these pads and subsequently for interconnecting the zones Z1, Z2 to the antenna.

FIGS. 3A (in a top view of the second grid) and 3B (cross-section of FIG. 3A) represent the assembly by lamination of the copper grids 2A and 2B; the adhesive 5 initially present on the second copper grid 2B is located between the two. There are no weak zones where the adhesive is present only in the direction perpendicular to the overall plane of the doubled-sided film.

It is noted in FIGS. 3A and 3B that the second metal layer 2B is arranged in relation to the first layer 2A or conversely, so as to overlap perpendicularly, either entirely or at least predominately, the dividing lines 16 or discontinuity lines of the contact pads or the metal zones of the first layer 2A.

In particular, a central metal zone Z3 covers perpendicularly the slots 18 formed between the lateral pads and the central pad. Of the module dual metallisation film. These slots 18 form weakness zones of the module that would be detrimental to the mechanical strength of the modules during the standardised bending/twisting tests, particularly ISO 7816.

According to this embodiment of the invention, the second layer 2B comprises at least portions completely or partly covering the slots 16 or zones of the first layer 24 free of conductive metal. In a variant of the second metal layer 2B, the latter may be a plate with cut-outs or a mesh having preferably regular openings dimensioned such as to provide a resistance equal to that of a more or less continuous metal layer (or film).

In FIG. 4, the chip is repositioned and connected. The antenna connection zones Z1, Z2 are broad (as a dotted line here), which represents an advantage both for the gold wire soldering and for antenna connection: the chip is adhesively attached and the wires soldered 13 in the wells 6 in the case of those connecting the contact surface 2A and the wires 14 (visible in FIG. 6) are soldered to the studs LA and LB of the chip and on the contactless pads 2B (comprising the interconnection zones Z1, Z2).

Figure 5A:
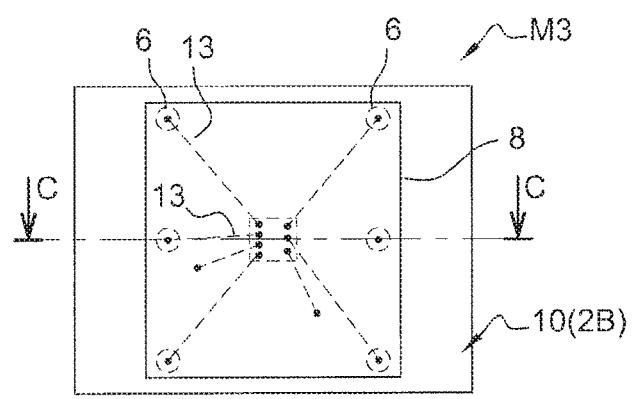
FIGS. 5A and 5B represent a diagrammatic view of a second embodiment of an electronic chip module M3 with contacts (single-interface) according to a third embodiment of the invention.
Figure 5B:
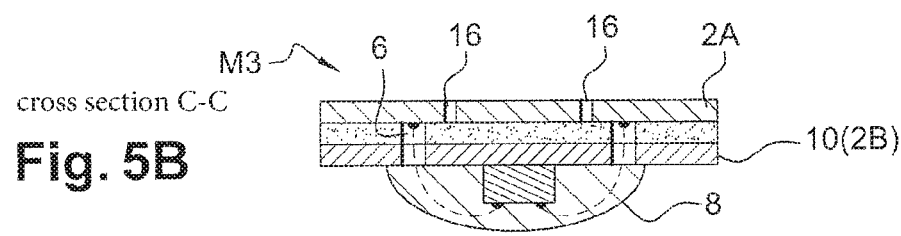

FIG. 5A and its cross-sectional view 5B illustrate a variant of the invention in the form described below; the same copper 2A is used for the contact pads as above in FIG. 4; in contrast, for the copper 2B (or metallisation) concealed in the card body, a continuous solid plate is employed merely having perforations 6 through the plate allowing soldering of the wires to the contact pads 2A. Alternatively, a grid with cut-outs or regular perforations may be used so as to avoid having any predetermined points of mechanical weakness at any position in the grid. Hence, the module M3 is a contact-only module, the dielectric of which has been replaced with a metal layer. This module comprises in this case the chip 7 repositioned, connected and encapsulated 8.

Figure 6:
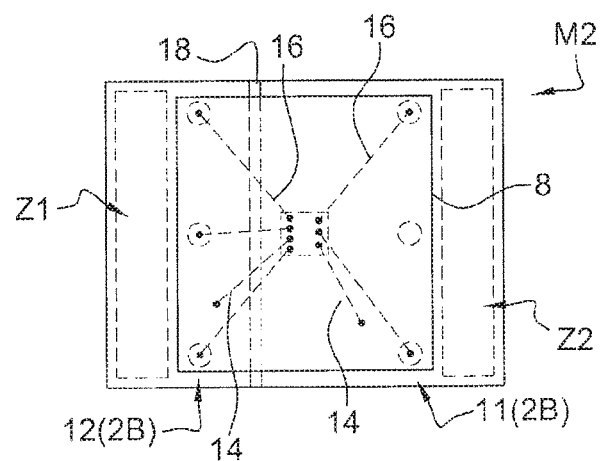
FIG. 6 represents a diagrammatic view of a third embodiment of a dual-interface electronic chip module M2 (contact and radiofrequency) without a dielectric in a bottom view and a cross-sectional view along C-C produced according to a second embodiment of the invention.

In FIG. 6, in another variant, the pads for connection to the antenna extend maximally in this case since the grid 2B comprises only two interconnection pads 12 (2B), 11 (2B) in this case, defining the two zones for interconnection Z1, Z2 to the antenna of the card body outside the encapsulation 8. This module M2 is similar to the construction in FIG. 4, apart from the fact that the layer 2B comprises 2 interconnection pads only. These pads 12, 11 offer a great deal of freedom for connection of the studs LA, LB of the chip to the interconnection pads via the connections 14.

Likewise, these pads provide a large surface for connection to a radiofrequency antenna located in a card body designed to receive the hybrid module M2. It is likewise observed that the dividing line 18 of these two pads is arranged such as not to cross or at least not be superimposed on a dividing line 16 of the first layer 2A.

By means of the invention, it is possible to produce a single-sided film via the same principle, by simply replacing the glass epoxy dielectric film with a plate or film of copper or another metal having at least the functionality of stiffening the assembly. Indeed, this proves highly economical, since copper is far less costly than the glass-epoxy dielectric.

According to another alternative or secondary method of implementation, the invention may employ a method of etching of metal or of the "leadframe" (LF) instead of the metal cutting method in the previous embodiments.

Figure 7:
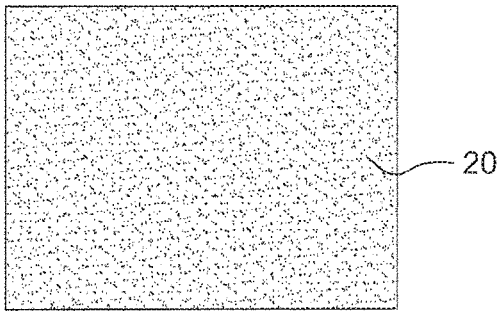
FIG. 7 illustrates a solid copper plate for a module location.

An alternative method by etching may involve the following in which plates are provided for at least one module or several modules (the plates may also be supplied as continuous tape or a large-size plate comprising several module positions to be cut out if necessary):

In FIG. 7, a metal plate or solid copper sheet 20 is provided for a module location. It may be obtained in particular from a rolling mill.

Figure 8:
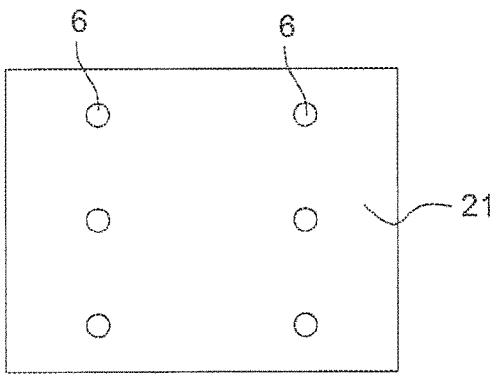
FIG. 8 illustrates another copper plate for a module location covered with an adhesive layer or film.

In FIG. 8, another plate or sheet of copper 21, for a module location, is provided with a covering of a layer or film of adhesive on one assembly surface (not visible in the figure); it comprises perforations 6, performed in particular by mechanical cut-out and preferably after assembling the adhesive in order to remove the adhesive from the perforations and offer a passage for connection wires, particularly by electrical soldering; alternatively, an already perforated adhesive can be laminated in the same places. Alternatively also, the adhesive can be removed from the perforations by laser or an electrical connection may be performed if necessary through the adhesive.

Figure 9:
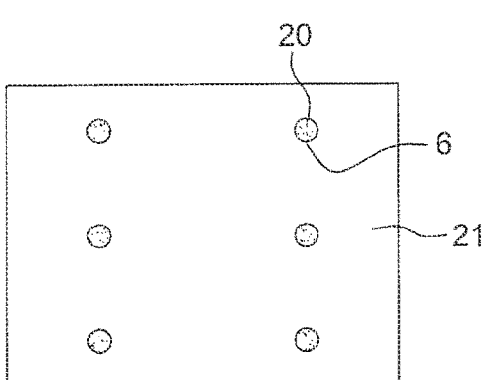
FIGS. 9 and 10 respectively illustrate a top view of a module and a view from underneath of the front view, wherein the copper plates in FIGS. 7 and 8 are laminated together one on top of the other.
Figure 10:
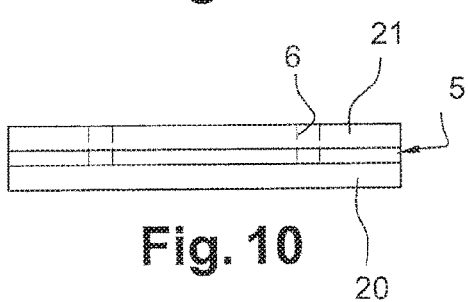

In FIGS. 9 and 10, the copper plates 20 and copper 21 are laminated together on to each other and are attached to each other by means of the adhesive 5 located between the two.

Figure 11:
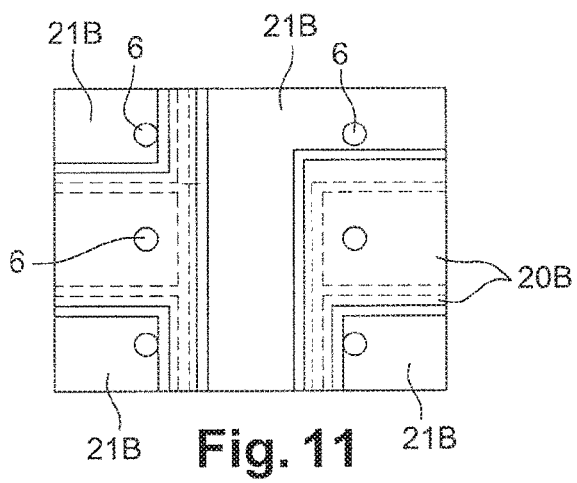
FIG. 11 illustrates a module or laminate obtained following chemical etching of both surfaces (or of at least one surface).

In FIG. 11, chemical etching of both surfaces (or of at least one surface) is performed by conventional technologies for producing metallised film. The visible surface in the figure comprises etchings of the interconnection pads 21B or soldering zone (these pads are normally intended to form the concealed surface of a module). The opposite surface of the module comprises an etching of the electrical contact pads 20B, particularly in ISO 7816 format for connecting a contact reader.

It is observed that the invention makes it possible to obtain, in this embodiment, a module (or in the general sense a laminate, a composite assembly comprising electrical or metal circuits without any holes passing completely through the resulting module).

Likewise, the module does not have any weakness zones where only adhesive is present. Consequently, at least one layer of copper is present over the entire surface of the plate assembly (or of the laminate). This module is therefore more resistant to bending/twisting tests than if it were to comprise crossings or overlappings of dividing lines of the contact or interconnection pads. As already explained, the module may comprise a number of minor crossings or overlappings that do not compromise the above-mentioned mechanical strength.

The invention claimed is:

1. An electronic module comprising a first conductive layer or sheet including at least one conductive surface, an electrically insulating layer consisting of a single layer of an adhesive connected to the first conductive layer or sheet via direct contact with a first surface of the single layer of adhesive, a second conductive layer or sheet connected to the single layer of adhesive via direct contact with the opposite surface thereof, and a chip or electronic chip disposed on the second conductive layer or sheet and electrically connected to said at least one conductive surface, through the electrically insulating layer,
   wherein the second conductive layer or sheet is made of metal and comprises holes or connection openings for electrically connecting the chip to said at least one conductive surface.

2. The electronic module according to claim 1, wherein the second conductive layer or sheet is arranged in relation to the first conductive layer or sheet or conversely, so as to overlap at least 30% of a total length of dividing lines or discontinuity lines of the first conductive layer or sheet.

3. The electronic module according to claim 1, wherein the second conductive layer or sheet is a layer with regular cut-outs or forms a grid.

4. The electronic module according to claim 1, wherein the second conductive layer or sheet forms at least two pads designed to connect to an antenna and extending over the entire bottom surface of the electronic module.

5. The electronic module according to claim 1, wherein the second conductive layer or sheet forms 1) at least one antenna and 2) pads for connection to the chip.

6. An electronic device comprising the module according to claim 1.

7. The electronic module according to claim 1, wherein the second conductive layer or sheet forms at least two pads.

8. The electronic module according to claim 1, wherein the first conductive layer or sheet is made of metal.

9. The electronic module according to claim 1, wherein the electrically insulating layer has a thickness of between 15-50 μm.

10. Method for manufacturing an electronic module comprising the steps of
- application of a metallic layer or sheet comprising at least one metal pad or zone,
- attachment of an electrically insulating layer selected from an adhesive, a heat-activated adhesive or an adhesive film, to a first surface of said metallic layer or sheet in order to form an assembly,
- perforation of the preceding two layers with connection orifices or openings for connecting an electronic component,
- attachment of a conductive layer comprising at least a conductive pad to the assembly via the insulating layer, wherein said metallic layer or sheet comprises openings or connection orifices to connect to the chip.

11. Method according to claim 10, wherein at least two zones or pads are formed in said metallic layer of sheet.

12. Method according to claim 10, wherein the metallic layer or sheet is arranged in relation to the conductive layer or conversely, so as to overlap perpendicularly, either entirely or at least 30% the dividing lines or discontinuity of said conductive layer.

13. Method according to claim 10, further comprising moving and electrical connection of an electronic chip to said at least one contact pad, through openings or orifices in the insulating layer and in said metallic layer or sheet.

* * * * *